United States Patent
Zamir et al.

(10) Patent No.: US 11,088,712 B2
(45) Date of Patent: Aug. 10, 2021

(54) ITERATIVE DECODER PERFORMANCE PREDICTION USING MACHINE LEARNING

(71) Applicant: Western Digital Technologies, Inc., San Jose, CA (US)

(72) Inventors: Ran Zamir, Ramat Gan (IL); David Avraham, Yehuda (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 86 days.

(21) Appl. No.: 16/675,165

(22) Filed: Nov. 5, 2019

(65) Prior Publication Data

US 2021/0135688 A1 May 6, 2021

(51) Int. Cl.
| | | |
|---|---|---|
| H03M 13/00 | (2006.01) |
| H03M 13/37 | (2006.01) |
| G06N 5/04 | (2006.01) |
| G06N 20/00 | (2019.01) |
| G06F 11/14 | (2006.01) |

(52) U.S. Cl.
CPC ..... *H03M 13/3746* (2013.01); *G06F 11/1476* (2013.01); *G06N 5/04* (2013.01); *G06N 20/00* (2019.01)

(58) Field of Classification Search
CPC ......... H03M 13/3746; H03M 13/2948; H03M 13/2951; H03M 13/2975; H03M 13/2996; G06N 20/00; G06N 3/0454; G06N 3/02; G06N 5/04
See application file for complete search history.

(56) References Cited

U.S. PATENT DOCUMENTS

| | | | |
|---|---|---|---|
| 7,260,766 B2 | 8/2007 | Levy et al. | |
| 8,301,979 B2 | 10/2012 | Sharon et al. | |
| 8,880,987 B2 | 11/2014 | Sharon et al. | |
| 8,938,660 B1 | 1/2015 | Varnica et al. | |
| 8,977,925 B2 | 3/2015 | Zaytsev et al. | |
| 9,043,674 B2 | 5/2015 | Wu et al. | |
| 10,068,557 B1* | 9/2018 | Engel | G06N 3/04 |
| 10,158,378 B1 | 12/2018 | Varnica et al. | |
| 10,372,539 B2 | 8/2019 | Avraham et al. | |
| 2006/0008279 A1 | 1/2006 | Chiang et al. | |
| 2010/0088575 A1 | 4/2010 | Sharon et al. | |
| 2010/0199149 A1 | 8/2010 | Weingarten et al. | |

(Continued)

OTHER PUBLICATIONS

International Search Report & the Written Opinion of the International Searching Authority dated Jul. 23, 2020, International Application No. PCT/US2020/024628.

(Continued)

*Primary Examiner* — Christine T. Tu
(74) *Attorney, Agent, or Firm* — Vierra Magen Marcus LLP

(57) ABSTRACT

An illustrative embodiment of this disclosure is an apparatus, including a memory, a processor in communication with the memory, and a decoder. The processor is configured to train a classifier, calculate one or more features of a codeword, predict an outcome of decoding the codeword with the decoder, and determine, using the classifier, whether the outcome satisfies a predetermined threshold. In some embodiments, based on the outcome, the processor selects a set of decoder parameters to improve decoder performance.

20 Claims, 9 Drawing Sheets

(56) References Cited

U.S. PATENT DOCUMENTS

| | | |
|---|---|---|
| 2013/0031447 A1 | 1/2013 | Sharon et al. |
| 2014/0201596 A1 | 7/2014 | Baum et al. |
| 2018/0113760 A1 | 4/2018 | Bhatia et al. |
| 2018/0343017 A1 | 11/2018 | Kumar et al. |
| 2018/0343082 A1 | 11/2018 | Xiong et al. |
| 2018/0357530 A1 | 12/2018 | Beery et al. |
| 2019/0066803 A1 | 2/2019 | Bhatia et al. |
| 2019/0068220 A1* | 2/2019 | Kumar ............... G06F 12/0246 |
| 2019/0073259 A1 | 3/2019 | Qin et al. |
| 2019/0114546 A1 | 4/2019 | Anil et al. |
| 2019/0155546 A1 | 5/2019 | Cai et al. |
| 2020/0184603 A1* | 6/2020 | Mukherjee ........... G06K 9/6256 |

OTHER PUBLICATIONS

Shokrollahi, Amin, "LDPC Codes: An Introduction," Digital Fountain, Inc., Apr. 2, 2003, 34 pages.

Cole, Chad A., et al., "A General Method for Finding Low Error Rates of LDPC Codes," L-3 Communications, Jun. 26, 2006, 30 pages.

Hu, Xiao-Yu, et al., "On the Computation of the Minimum Distance of Low-Density Parity-Check Codes," 2004 IEEE International Conference on Communications, Jun. 2004, 17 pages.

\* cited by examiner

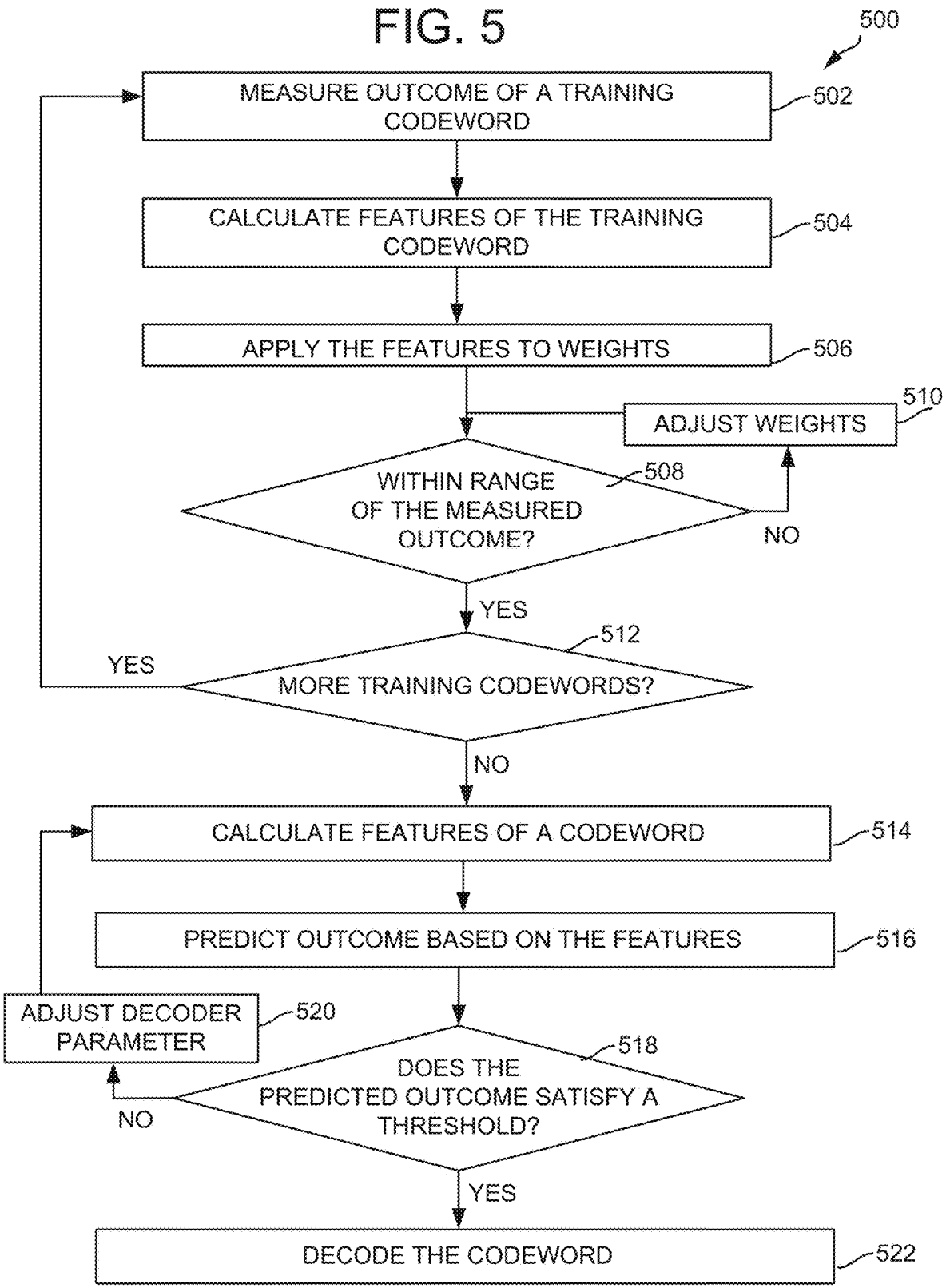

ITERATIVE DECODER PERFORMANCE PREDICTION USING MACHINE LEARNING

BACKGROUND

The present disclosure, in various embodiments, relates to non-volatile memory and more particularly to iterative decoder performance prediction.

In the last few years, iterative decoding codes such as low-density parity-check (LDPC) and turbo-codes have become the standard in the wireless and storage industries due to capacity-approaching correction capability and practical encoder and decoder implementations. For example, existing systems use various bit flipping (BF) decoders that flip the bits based on information available for variable nodes. BF decoders are easy to implement in hardware and provide significant area and power savings over other iterative decoders.

Unfortunately, the decoding process for LDPC and turbo-codes is not deterministic: the decoder may converge after just a few iterations (microseconds), converge after many iterations (milliseconds), or fail altogether. Thus, the existing LDPC and turbo-codes may not comply with quality-of-service (QoS) or "Fast-Fail" mode requirements. It would be advantageous to have a uniform or near-uniform convergence time for all LDPC and turbo-code codewords.

SUMMARY

An illustrative embodiment disclosed herein is an apparatus, including a memory and a processor in communication with the memory. The processor is configured to train a classifier, calculate one or more features of a codeword, predict an outcome of decoding the codeword, and determine, using the classifier, whether the outcome satisfies a predetermined threshold.

Another illustrative embodiment disclosed herein is a method, including training, by a processor, a classifier, calculating, by the processor, one or more features of a codeword, predicting, by the processor, an outcome of decoding the codeword, and determining, by the processor and using the classifier, whether the outcome satisfies a predetermined threshold.

Another illustrative embodiment disclosed herein is an apparatus, including a memory and processing means in communication with the memory. The processing means includes means for training a classifier, means for calculating one or more features of a codeword, means for predicting an outcome of decoding the codeword, and means for determining whether the outcome satisfies a predetermined threshold.

BRIEF DESCRIPTION OF THE DRAWINGS

FIG. 5 is a flow chart of a process for predicting iterative decoder performance, in accordance with some embodiments of the present disclosure.

DETAILED DESCRIPTION

Figure 1:
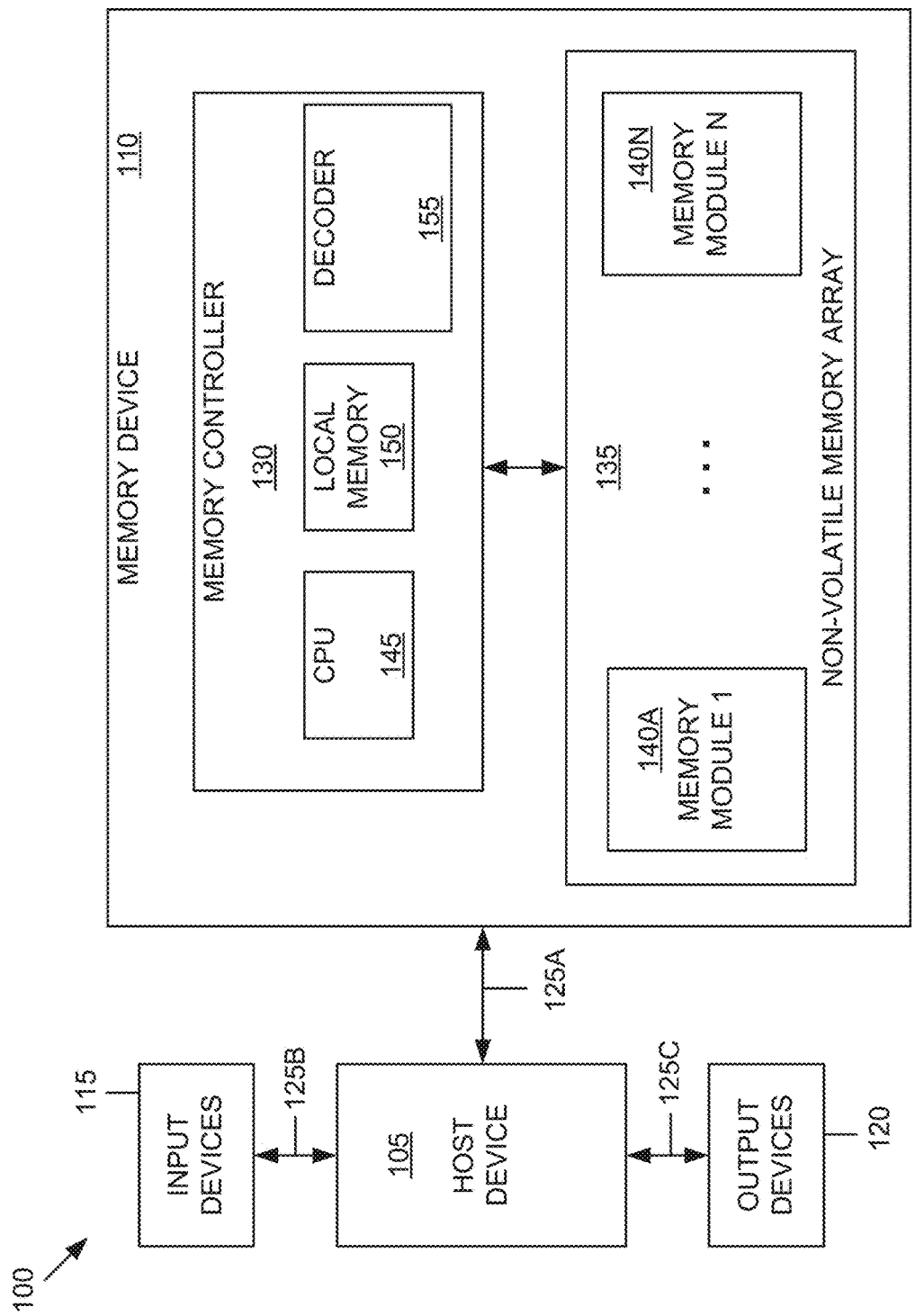
FIG. 1 depicts a schematic block diagram of a computing system in accordance with some embodiments of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present invention, as generally described herein, and illustrated in the figures, can be arranged, substituted, combined, and designed in a wide variety of different configurations, all of which are explicitly contemplated and make part of this disclosure.

In one previous approach, the NAND page bit error rate (BER) is estimated via syndrome weight (SW) and the decoder performance is predicted based on the BER. One issue with the previous approach is that the BER estimation from the SW is noisy and less accurate for high SW values. A single high SW value can correspond to a relatively wide range of BER levels. Moreover, knowing the exact BER is not sufficient to precisely predict the decoder performance, as the decoder outcome depends on an error pattern of the codeword. Finally, when using irregular LDPC codes, the SW becomes less correlated with the actual BER resulting in a less accurate estimation. Without a reliable prediction mechanism under the previous approach, the decoder needs to account for a maximum decoding time of the estimated range. In some instances, the decoder does not converge after iterating for the maximum decoding time. What is needed is a uniform or near-uniform convergence time for all LDPC or turbo-code codewords.

Some embodiments of the present disclosure propose a method of predicting the outcome of the low-density parity-check (LDPC) decoding process, in terms of success and latency. In some embodiments of the present disclosure, a system and a method uses machine learning techniques to get a multidimensional view of the error pattern characteristics and a decoder state to train a classifier that predicts the decoder success and latency. In some embodiments, the system trains two classifiers to determine whether the decoder will succeed and whether the decoding process will take longer than a predetermined number of iterations or time. The predetermined number of iterations or time may be determined by the system or host requirement. In some embodiments, each classifier uses a syndrome weight and a syndrome count histogram. The syndrome count histogram is a number of variable nodes with a given number of unsatisfied checks.

In some embodiments, if the classifier predicts a failure, or if the classifier predicts a latency or number of iterations that exceeds a predefined threshold, the decoder can take one or more actions. The actions include selecting one or more decoder parameters to optimize decoder performance. The decoder parameters include LLRs (log-likelihood ratio), bit-flipping thresholds (i.e., that are error pattern dependent), damping factors, iteration numbers, clipping values, etc. The actions can include changing a clock frequency/puncturing of the decoder. For example, the decoder can raise the clock frequency if the operation exceeds a certain latency. The actions can include selecting an appropriate decoding gear to use that results in an improved latency or reduced power consumption. The actions can include sending a soft-bit read to be ready in case of a decoding failure. The actions can include reading a voltage threshold calibration or other NAND commands (e.g., read with DLA on). In some embodiments, the system is performing the actions or enabling a corresponding host perform the actions.

Advantageously, some embodiments of the present disclosure improve latency and QoS. If the classifier predicts excess latency or a decoder failure, then the system may employ alternatives that improve the read latency, such as read soft-bits, threshold calibration, XOR recovery, etc., instead of allowing the decoder to run until a timeout event. Predicting the decoder behavior and performing alternative actions can save hundreds of micro-seconds and up to milliseconds. Further, some embodiments of the present disclosure allow reporting a fast failure to the host in set-ups that permit Fast-Fail modes, such as Microsoft zone namespace (MSFT ZNS). Fast-Fail modes include a guarantee that if the decoder fails, the decoder fails fast.

Referring now to FIG. 1, a schematic block diagram of a computing system 100 is shown, in accordance with some embodiments of the present disclosure. The computing system 100 preferably is a non-volatile memory system, such as a Flash memory system. The computing system 100 includes a host device 105 in communication with a memory device 110. The host device 105 may be configured to receive input from one or more input devices 115, and provide output to one or more output devices 120. The host device 105 may be configured to communicate with the memory device 110, the input devices 115, and the output devices 120 via appropriate interfaces 125A, 125B, and 125C, respectively. The computing system 100 may be implemented in any of a variety of computing devices such as computers (e.g., desktop, laptop, etc.), tablets, personal digital assistants, mobile devices, wearable computing devices such as smart watches, other handheld or portable devices, or any other computing device suitable for performing operations using the host device 105.

The input devices 115 includes any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is in communication with the host device 105 and that allows an external source, such as a user, to enter information (e.g., data) into the host device 105 and send instructions to the host device 105. Similarly, the output devices 120 includes any of a variety of output technologies such as external memories, printers, speakers, displays, microphones, light emitting diodes, headphones, plotters, speech generating devices, video devices, global positioning systems, and any other output peripherals that are configured to receive information (e.g., data) from the host device 105. The "data" that is either input into the host device 105 and/or output from the host device 105 includes any of a variety of textual data, graphical data, video data, sound data, position data, combinations thereof, or other types of analog and/or digital data that is suitable for processing using the computing system 100.

Although not shown, the host device 105 includes one or more processing units in communication with the memory device 110 and that may be configured to execute instructions for running one or more applications. In some embodiments, the instructions and data needed to run the one or more applications may be stored within the memory device 110. In such cases, the host device 105 may request the memory device 110 to retrieve the data and instructions. The data and instructions may, at least temporarily, be stored within a memory on the host device 105. The host device 105 may be configured to store the results of running the one or more applications within the memory device 110. Thus, the host device 105 may be configured to request the memory device 110 to perform a variety of operations. For example, the host device 105 may request the memory device 110 to read data, write data, update or delete data, and/or perform management or other operations.

The memory device 110 includes a memory controller 130 that may be configured to read data from or write data to a non-volatile memory array 135. The memory controller 130 includes, in some embodiments, a central processing unit (CPU) 145, local memory 150, and a decoder 155, such as an iterative decoder. The CPU 145 is in communication with memory (e.g., the local memory 150 or the non-volatile memory array 135) and can execute instructions stored in the memory. The CPU 145 is in communication with, or is included in, the decoder 155, and can execute instructions for performing operations in the decoder 155. The decoder 155 decodes encoded data.

The non-volatile memory array 135 includes one or more memory devices such as memory devices 140A-140N. Each of the memory devices 140A-140N includes any of a variety of non-volatile memory types. For example, in some embodiments, one or more of the memory devices 140A-140N includes NAND flash memory cores. In other embodiments, one or more of the memory devices 140A-140N includes one or more of NOR flash memory cores, Static Random Access Memory (SRAM) cores, Dynamic Random Access Memory (DRAM) cores, Magnetoresistive Random Access Memory (MRAM) cores, Phase Control Memory (PCM) cores, Resistive Random Access Memory (ReRAM) cores, 3D XPoint memory cores, ferroelectric random-access memory (FeRAM) cores, and other types of memory cores that are suitable for use within the non-volatile memory array 135. The local memory 150 includes volatile memory (e.g., RAM or cache) or non-volatile memory (e.g., an instance of the memory module 140A).

The memory devices 140A-140N may be individually and independently controlled by the memory controller 130. In other words, the memory controller 130 may be configured to communicate with each of the memory devices 140A-140N individually and independently. As discussed in greater detail below, the memory devices 140A-140N may remain in a standby state until the memory controller 130 desires to establish communication with one of the memory devices by generating a chip select or chip enable signal. The memory controller 130 may be configured as a logical block or circuitry that receives instructions from the host device 105 and performs operations in accordance with those instructions. For example, the memory controller 130 may be configured to read data from or write data to one or more of the memory devices 140A-140N. The memory controller 130 may be situated on the same or a different die as the non-volatile memory array 135, but preferably the controller is packaged with the memory array 135.

It is to be understood that only some components of the computing system 100 are shown and described in FIG. 1. However, the computing system 100 may include other components such as various batteries and power sources, networking interfaces, routers, switches, external memory systems, controllers, etc. Generally speaking, the computing system 100 may include any of a variety of hardware, software, and/or firmware components that are needed or considered desirable in performing the functions described herein. Similarly, the host device 105, the input devices 115, the output devices 120, and the memory device 110 including the memory controller 130 and the non-volatile memory array 135, may include other hardware, software, and/or firmware components that are considered necessary or desirable in performing the functions described herein.

An error correction code (ECC) is a set of codewords that satisfies a given set of constraints. One commonly used class of error correction codes is binary linear block codes, in which the code is defined through a set of parity-check constraints on the codeword bits. In other words, a binary linear block code is defined by a set of linear equations that a valid codeword satisfies. The set of linear equations can be described via a parity-check matrix H of M rows, such that each row of the matrix defines one parity-check constraint and a word C constitutes a valid codeword if and only if H·C=0.

Figure 2:
FIG. 2 depicts a parity check matrix, in accordance with some embodiments of the present disclosure.

Referring now to FIG. 2, a parity check matrix 200 is shown, in accordance with some embodiments of the present disclosure. The check matrix 200 includes M rows (i.e., check nodes) and N=K+M columns (i.e., variable nodes). Each row length N and corresponds to N bits (i.e., K information bits and M parity) in each codeword of length N. Further, the parity bits are defined such that M parity check equations are satisfied. Each row of the matrix represents a parity check equation.

During decoding, the decoder attempts to satisfy the parity checks. In the example illustrated in the check matrix 200 of FIG. 2, there are ten parity checks, as indicated by the check nodes cn1 through cn10. The parity check at a check node is determined by the inclusion or selection of variable nodes v1 through v13 with respect to the check node. In the example of the check matrix 200, the first parity check at cin1 determines if v2 XOR v4 XOR v11 XOR v13=0. XOR denotes an exclusive-or logical operation. This check is satisfied if there is an even number of "1" in bits corresponding to variable nodes v2, v4, v11, and v13 (i.e., in the variable node elements in the check matrix 200 marked with an "x"). The second parity check at cn2 determines if v1 XOR v7 XOR V12=0, the third parity check at cn3 determines if v3 XOR v5 XOR v6 XOR v9 XOR v10=0, the fourth parity check at cn4 determines if v2 XOR v8 XOR v11=0, the fifth parity check at cn5 determines if v4 XOR v7 XOR V12=0, the sixth parity check at cn6 determines if v1 XOR v5 XOR v6 XOR v9=0, the seventh parity check at cn7 determines if v2 XOR v8 XOR v10 XOR v13=0, the eighth parity check at cn8 determines if v4 XOR v7 XOR v11 XOR V12=0, the ninth parity check at cn9 determines if v1 XOR V3 XOR v5 XOR v13=0, and the tenth parity check at cn10 determines if v7 XOR v8 XOR v9 XOR v10=0.

The vector S=H·C is commonly known as the syndrome vector associated with an input codeword, C (i.e., the word to be decoded). The multiplication is performed with modulo-2 arithmetic. Each element of the syndrome vector is associated with one of the parity check equations, and the value of the element is 0 for an equation that is satisfied by C and 1 for an equation that is not satisfied by C. The elements of the syndrome vector also are called "bits" of the syndrome vector herein. The syndrome weight ($W_s$) is the number of unsatisfied equations represented by the syndrome vector S. The syndrome weight, $W_s$, is a sum of the element values of the syndrome vector S. The word, C, is a valid codeword if the syndrome vector, S, associated with the word includes all zeros and the corresponding syndrome weight, $W_s$, is zero.

The vector u=S·H is a number of unsatisfied checks for each bit. A syndrome count vector is a count of how many bits have 0 unsatisfied checks, how many bits have 1 unsatisfied checks, and so on. The syndrome count[i] =|{$u_b$=i}|, i=0, . . . , dv, wherein dv=a maximal variable (node) degree.

Error correction codes may be based on iterative coding schemes, such as Low-Density Parity-Check (LDPC) codes and Turbo codes. As is understood by those of skill in the art, in iterative coding schemes, decoding is performed using an iterative algorithm that iteratively updates its estimates of the codeword bits until the algorithm converges to a valid codeword. The iteratively updated estimates can be either "hard" estimates (e.g., 1 or 0) or "soft" estimates, which include an estimate of the bits value (e.g., 1 or 0), together with some reliability measure of the estimate indicating a probability that the estimated value is correct. A commonly used soft estimate is the Log Likelihood Ratio (LLR). The LLR is a ratio of the probability of the bit being 0 to the probability of the bit being 1. A positive LLR indicates that the bit is estimated to be more likely to be 0 than 1. A negative LLR indicates that the bit is estimated to be more likely to be 1 than 0. The absolute value of the LLR is an indication of a certainty of the estimate.

Figure 3A:
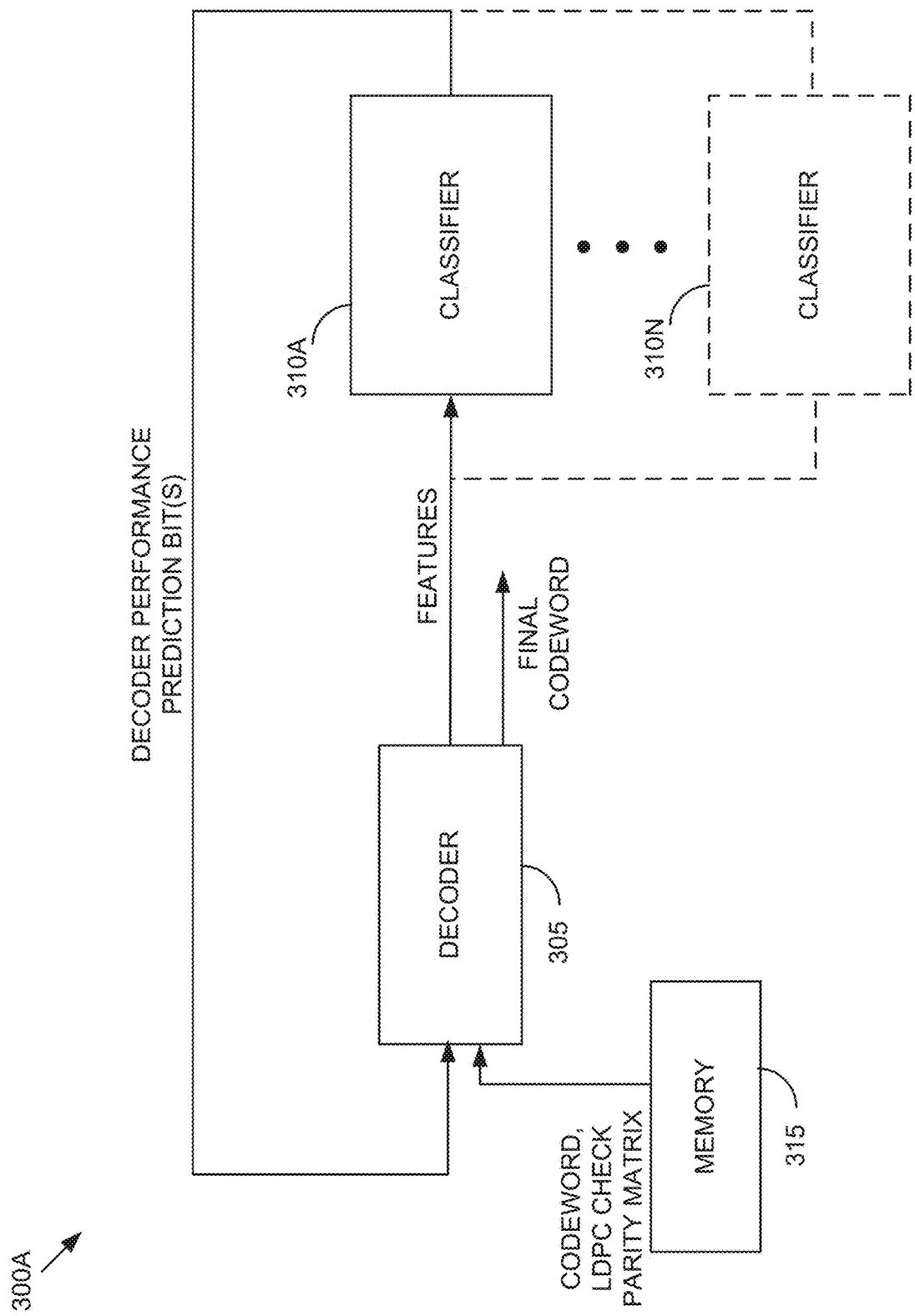
FIG. 3A depicts a schematic block diagram of a decoder system, in accordance with some embodiments of the present disclosure.

Referring now to FIG. 3A, a schematic block diagram of a decoder system 300A is shown, in accordance with some embodiments of the present disclosure. The decoder system 300A includes a decoder (e.g., an iterative decoder or iterative ECC decoder) 305, one or more classifiers 310A-310N, and a memory 315. For sake of brevity, operations of one or more processors (e.g., the CPU 145) associated with the decoder 305 or the one or more classifiers 310A-310N are described as operations of the decoder 305 or the one or more classifiers 310A-310N, respectively. The decoder 305 fetches an LDPC parity check matrix (e.g., the M×N check matrix 200) and an initial estimate of a codeword. The decoder 305 iteratively decodes the codeword. After a decoding iteration, the decoder updates the previous codeword to an updated codeword. After the decoder 305 determines that the updated codeword is the final codeword, the decoder 305 outputs the final codeword. In some embodiments, the decoder 305 determines that the updated codeword is the final codeword when a syndrome weight associated with the updated codeword is zero.

The decoder 305 is in communication with a memory 315 and receives the initial codeword and the LDPC parity check matrix from the memory 315. The decoder 305 computes features based on the initial codeword and the LDPC parity check matrix. The features may include an initial syndrome weight and an initial syndrome count. In some embodiments, the decoder computes features after one or more decoding iterations. The features computed after one or more decoding iterations may include a syndrome weight after one or more decoding iterations, a syndrome count after one or more decoding iterations, and the like. The decoder 305 is in communication with the one or more classifiers 310A-310N and sends the features to the one or more classifiers 310A-310N.

Each of the classifiers 310A-310N generate one or more decoder performance prediction bits based on the features received from the decoder 305. Each of the one or more classifiers 310A-310N may use heuristics or machine learning techniques. The one or more classifiers 310A-310N may include linear classifiers, support vector machine (SVM), k-nearest neighbors (KNN), decision trees, neural network, and the like. In some embodiments, the neural network includes a conventional neural network, a feedforward neural network, a probabilistic neural network, and the like. In some embodiments, the neural network includes an input layer, an output layer and, optionally, one or more hidden layers.

The one or more classifiers 310A-310N predict an outcome (e.g., a time or number of iterations for the training codeword to converge or an indication of whether the training codeword converges) of the decoder 305. In some embodiments, the classifier 310A predicts whether the decoder 305 successfully decodes the codeword (i.e., whether the decoder 305 converges to a valid codeword). In some embodiments, the classifier 310A predicts whether the decoder 305 decodes the codeword received within a predetermined time or number of decoding iterations. Each of the one or more classifiers 310A-310N may generate one or more bits for a specific aspect of the decoder performance prediction. For example, the one or more classifiers 310A-310N may include the first classifier 310A and a second classifier 310B. The first classifier 310A may predict whether the decoder 305 converges to a valid codeword and the second classifier 310B may predict whether the decoder 305 decodes the codeword within a predetermined time or number of decoding iterations. As shown in the decoder system 300A of FIG. 3A, the one or more classifiers 310A-310N send the decoder performance prediction bits to the decoder 305. In some embodiments, in response to receiving decoder performance prediction bits indicating either no convergence or convergence exceeding the predetermined time or number of iterations, the decoder 305 (a) adjusts parameters for decoding the codeword, resets the codeword to the initial set of values, and restarts decoding iterations, or (b) discards the codeword and begins decoding a next codeword. In some embodiments, in response to receiving decoder performance prediction bits indicating convergence in less than the predetermined time or number of iterations, the decoder 305 continues decoding the codeword, or, if the codeword is already decoded, does nothing.

Figure 3B:
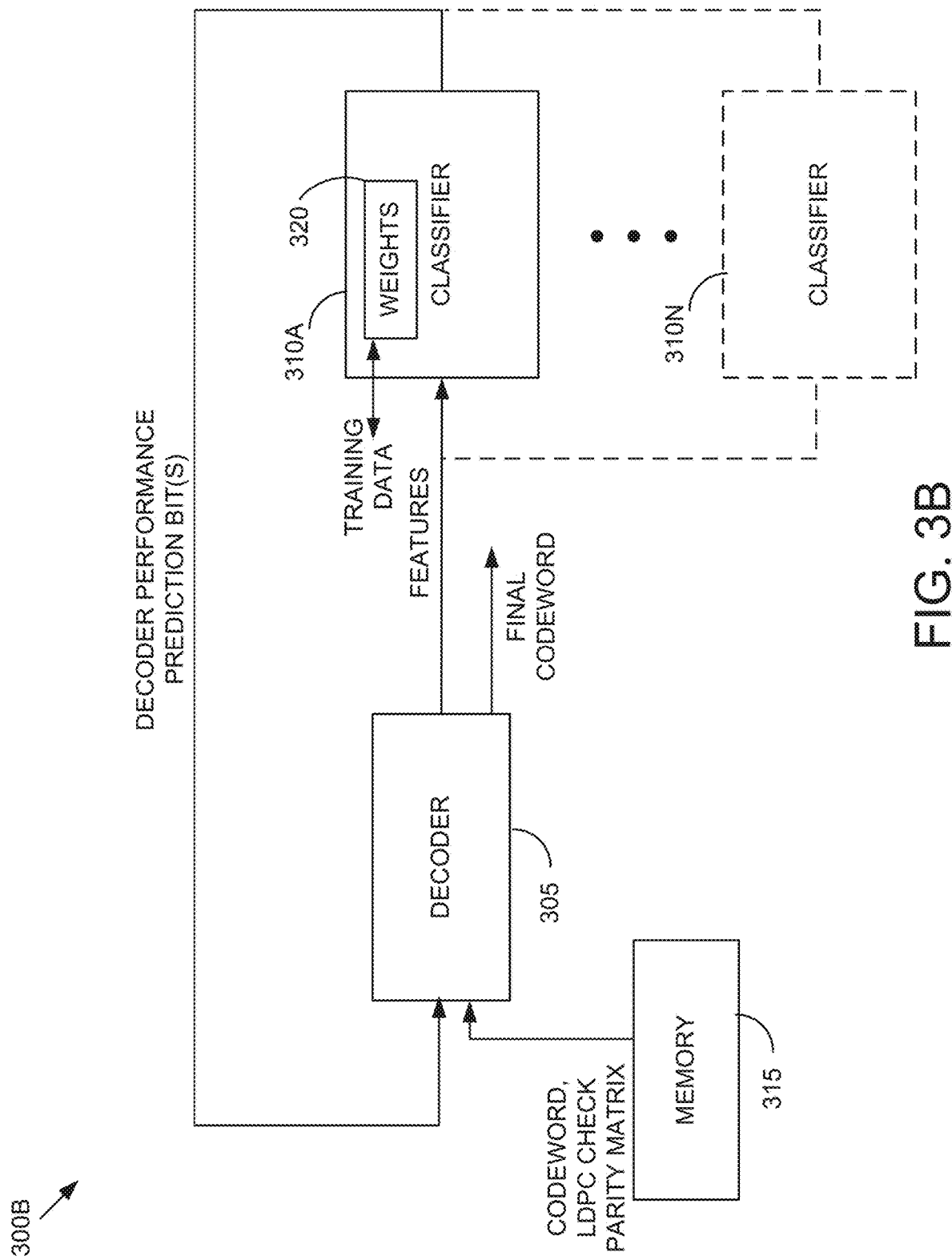
FIG. 3B depicts a schematic block diagram of a decoder system, in accordance with some embodiments of the present disclosure.

Referring now to FIG. 3B, a schematic block diagram of a decoder system 300B is shown, in accordance with some embodiments of the present disclosure. In some embodiments, the decoder system 300B is similar to the decoder system 300A. In some embodiments, each of the classifiers 310A-310N include weights 320 and each of the classifiers 310A-310N receive training data during a training phase. Without loss of generality, the weights 320 and the training data are described with respect to the classifier 310A. In some embodiments, the training data represents a random distribution of training codewords. The random distribution of initial codewords may be generated using a noise generator. In some embodiments, for each training codeword a first outcome is measured (e.g., a time or number of iterations for the training codeword to converge or an indication of whether the training codeword converges). In some embodiments, features are calculated for each of the training codewords. In some embodiments, for each of the training codewords and using the weights 320, the classifier 310A calculates a second outcome. In other words, the classifier 310A applies one or more of the features to the weights 320, in some embodiments. In some embodiments, each of the features are multiplied by a corresponding one of the weights, and the products are summed. In some embodiments, the classifier 310A compares, for each training word, the calculated outcome to the measured outcome. In some embodiments, the classifier 310A adjusts the weights 320 until, for each training word or a predetermined percentage of the training words, the calculated outcome is within a predetermined range of the measured outcome.

Figure 3C:
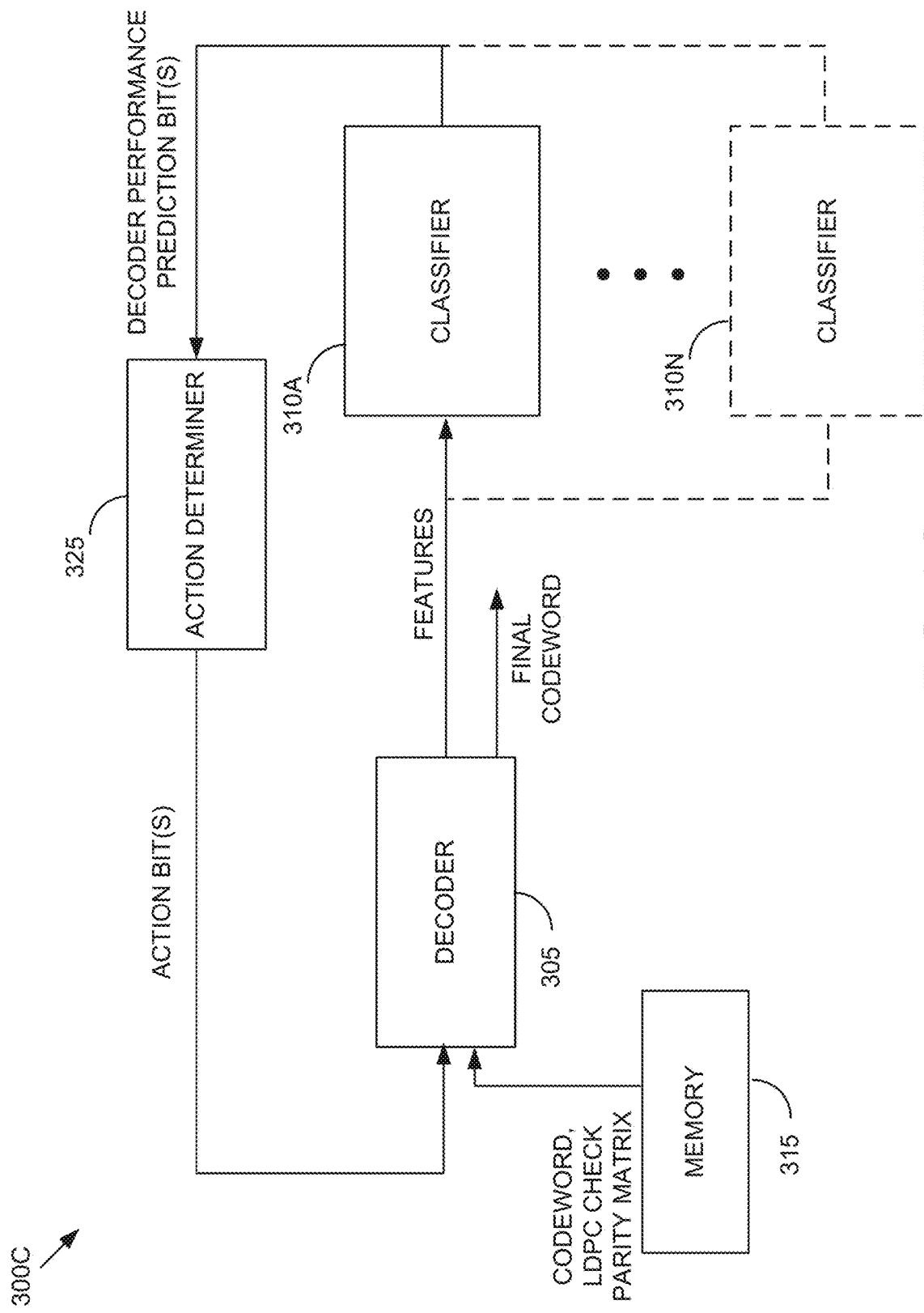
FIG. 3C depicts a schematic block diagram of a decoder system, in accordance with some embodiments of the present disclosure.

Referring now to FIG. 3C, a schematic block diagram of a decoder system 300C is shown, in accordance with some embodiments of the present disclosure. In some embodiments, the decoder system 300C is similar to the decoder system 300A. In some embodiments, the decoder system 300C includes an action determiner 325. The action determiner 325 receives the decoder performance prediction bits from the one or more classifiers 310A-310N. The action determiner 325 selects, calculates, or otherwise determines one or more action bits corresponding to one or more actions. The one or more actions may include changing one or more decoder parameters (e.g., changing one or more parameters including LLRs, bit-flipping thresholds, damping factors, iteration numbers, clipping values, frequency/puncturing of the decoder, decoding gear, a soft-read bit, and a read voltage threshold). Changing the clock frequency can include raising the clock if the operation exceeds a certain latency or the number of iterations exceeds a certain number. The decoding gear can be a switch that selects one of a plurality of decoders to use. The one or more actions may include sending a soft-read bit, calibrating a read voltage threshold, or performing other NAND commands (e.g., read with DLA on). The action determiner 325 sends the one or more action bits to the decoder 305. Adjusting decoding parameters can help achieve an optimal tradeoff between latency and optimal power consumption. In some embodiments, the action determiner 325 is implemented as a mapping structure that maps prediction bits to actions or decoder parameters. The mapping structure may be stored in the memory 315.

Figure 3D:
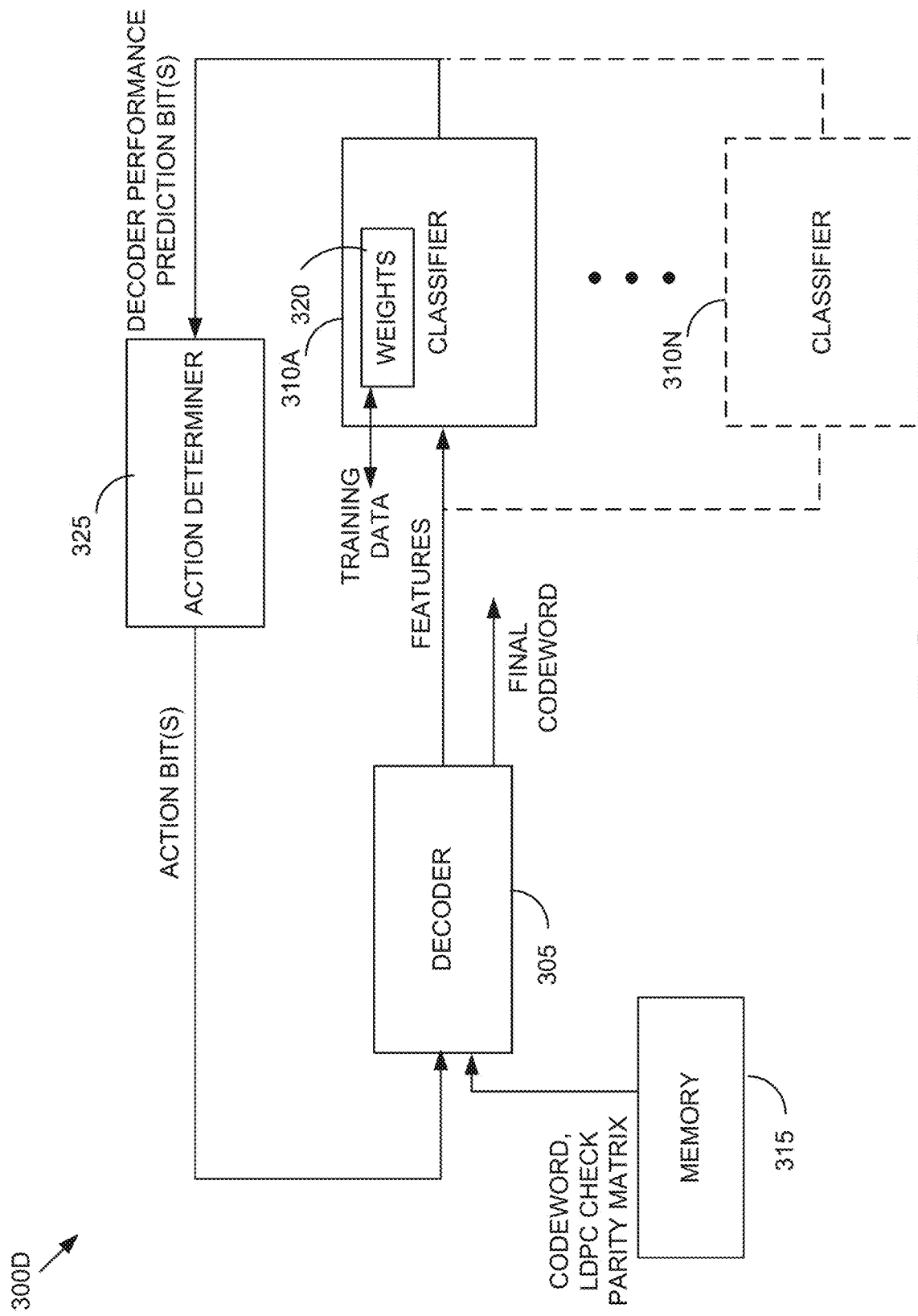
FIG. 3D depicts a schematic block diagram of a decoder system, in accordance with some embodiments of the present disclosure.

Referring now to FIG. 3D, a schematic block diagram of a decoder system 300D is shown, in accordance with some embodiments of the present disclosure. In some embodiments, the decoder system 300D is similar to the decoder system 300A. In some embodiments, the decoder system 300D includes aspects of the decoder system 300B (e.g., the weights 320 and the training data) and the decoder system 300C (e.g., the action determiner 325).

In some embodiments, the decoder 305, each of the one or more classifiers 310A-310N, and the action determiner share a processor or have their own dedicated processor. In some embodiments, the decoder 305 is an instance of the decoder 155 with respect to FIG. 1. In some embodiments, the memory 315 is an instance of the local memory 150 or one or more of the memory modules 140A-140N with respect to FIG. 1. In some embodiments, the one or more classifiers 310A-310N and/or the action determiner 325 are included in the decoder 305 and/or in the memory controller 130 with respect to FIG. 1.

Figure 4A:
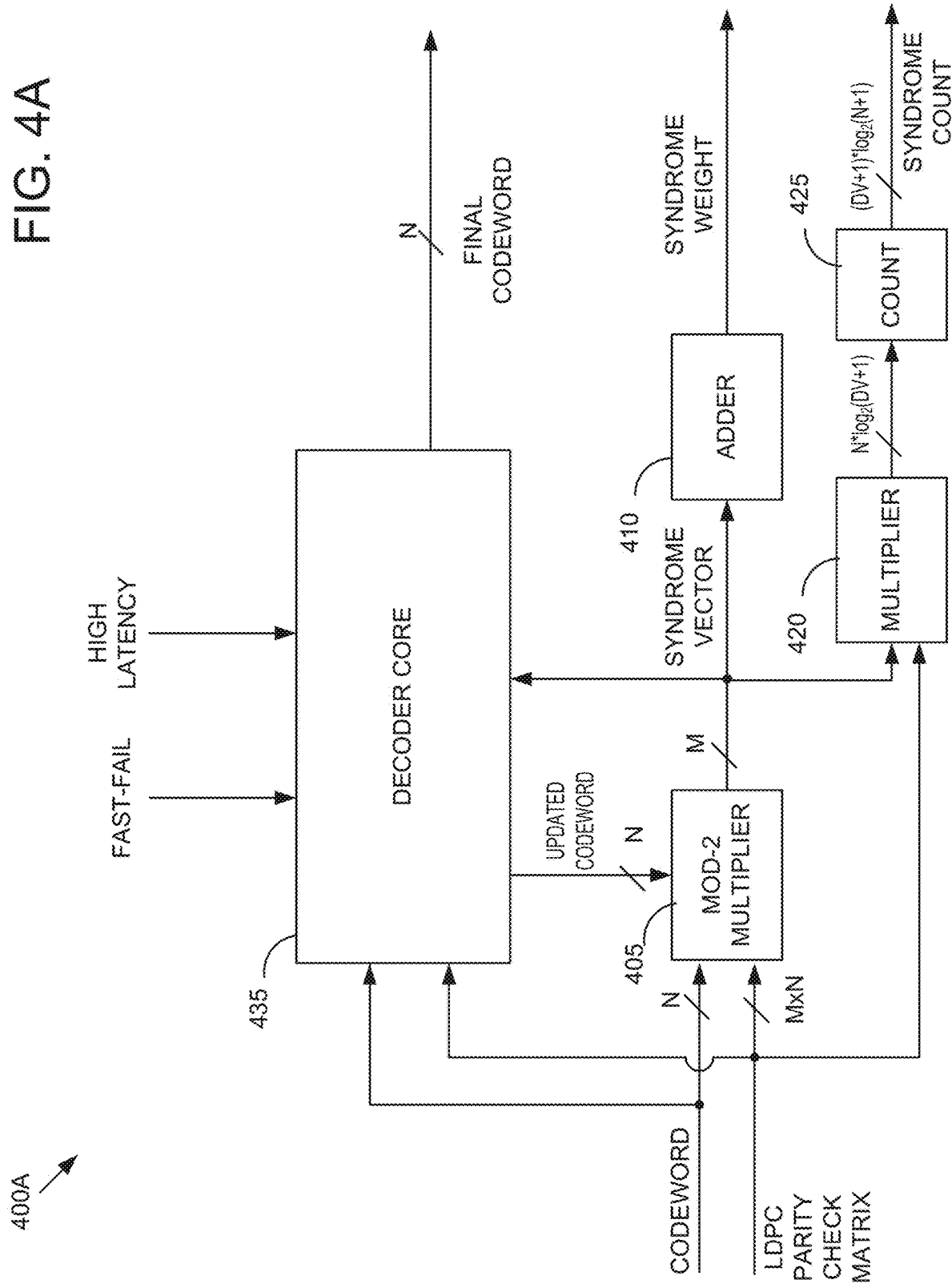
FIG. 4A is a schematic block diagram of a decoder, in accordance with some embodiments of the present disclosure.

Referring now to FIG. 4A, a schematic block diagram of the decoder 400A is shown, in accordance with some embodiments of the present disclosure. In some embodiments, the decoder 400A is an instance of the decoder 305.

The decoder 400A includes a modulo-2 (mod-2) multiplier 405, an adder 410, a multiplier 420, a counter 425, and an decoder core 435.

The decoder 400A generates syndrome bits and/or syndrome weight. The modulo-2 multiplier 405 mod-2 multiplies an M×N LDPC parity check matrix and an N-bit codeword to determine an M-bit syndrome vector, In some embodiments, the N-bit codeword is updated after every decoder iteration. The N bits include K information bits and M parity bits. The adder 410 adds the bits of the M-bit syndrome vector to determine a syndrome weight. The decoder 400A outputs the syndrome weight. In some embodiments, the decoder 400A outputs an updated syndrome weight after every decoder iteration. In some embodiments, the syndrome weight is stored in a buffer. After a predetermined number of syndrome weights are stored in the buffer, the buffer outputs the number of syndrome weights.

The decoder 400A generates syndrome counts (also known as syndrome count vectors). The multiplier 420 multiplies the M-bit syndrome vector and the LDPC parity check matrix to determine a vector indicating a number of unsatisfied checks for each element. The vector has N first elements. Each of the first elements have a value in the range of 0 to DV (i.e., each element has a width $\log_2(DV+1)$ bits). DV is the maximal number of unsatisfied checks. The counter 425 determines a syndrome count vector. The syndrome count vector has DV+1 second elements. The counter 425 determines the syndrome count vector by binning each of the N first elements into one of the DV+1 second elements based on the value the first element. Each of the DV+1 second elements have a value in the range of 0 to N (i.e., each second element has a width of $\log_2(N+1)$ bits). The decoder 400A outputs the syndrome count vector. In some embodiments, the decoder 400A outputs an updated syndrome count vector after every decoder iteration. In some embodiments, the syndrome count vector is stored in a buffer. After a predetermined number of syndrome count vectors are stored in the buffer, the buffer outputs the number of syndrome count vectors.

In some embodiments, the decoder core 435 receives the N-bit codeword, the M×N-bit LDPC parity check matrix, the M-bit syndrome vector, a fast-fail indicator, and a high latency indicator (collectively, decoder core inputs). The ECC decoder core 435 iterates the codeword based on the decoder core inputs, in some embodiments. In some embodiments, after every iteration, the decoder core outputs an updated codeword (e.g., to be used to generate an update syndrome weight and updated syndrome count). In some embodiments, the decoder core 435 determines and outputs an N-bit final (valid) codeword. In some embodiments, the ECC decoder core 435 determines the N-bit final codeword as the updated codeword when the syndrome vector results in a syndrome weight of zero.

In some embodiments, the fast-fail indicator indicates a fast-fail condition (e.g., the decoder core 435 is unable to converge to a valid codeword). In some embodiments, responsive to the fast-fail indicator indicating a fast-fail condition, the decoder core 435 stops iterating. In some embodiments, the high latency indicator indicates a high latency condition (e.g., that the decoder takes more than a predetermined amount of time or number of iterations to converge). In some embodiments, responsive to the high latency indicator indicating a high latency condition, the decoder core changes a parameter in order to reduce the time or number of iterations to converge. In some embodiments, at least one of the fast-fail indicator and the high latency indicator includes one or more actions received from the action determiner 325 as shown in FIG. 3C or FIG. 3D.

Figure 4B:
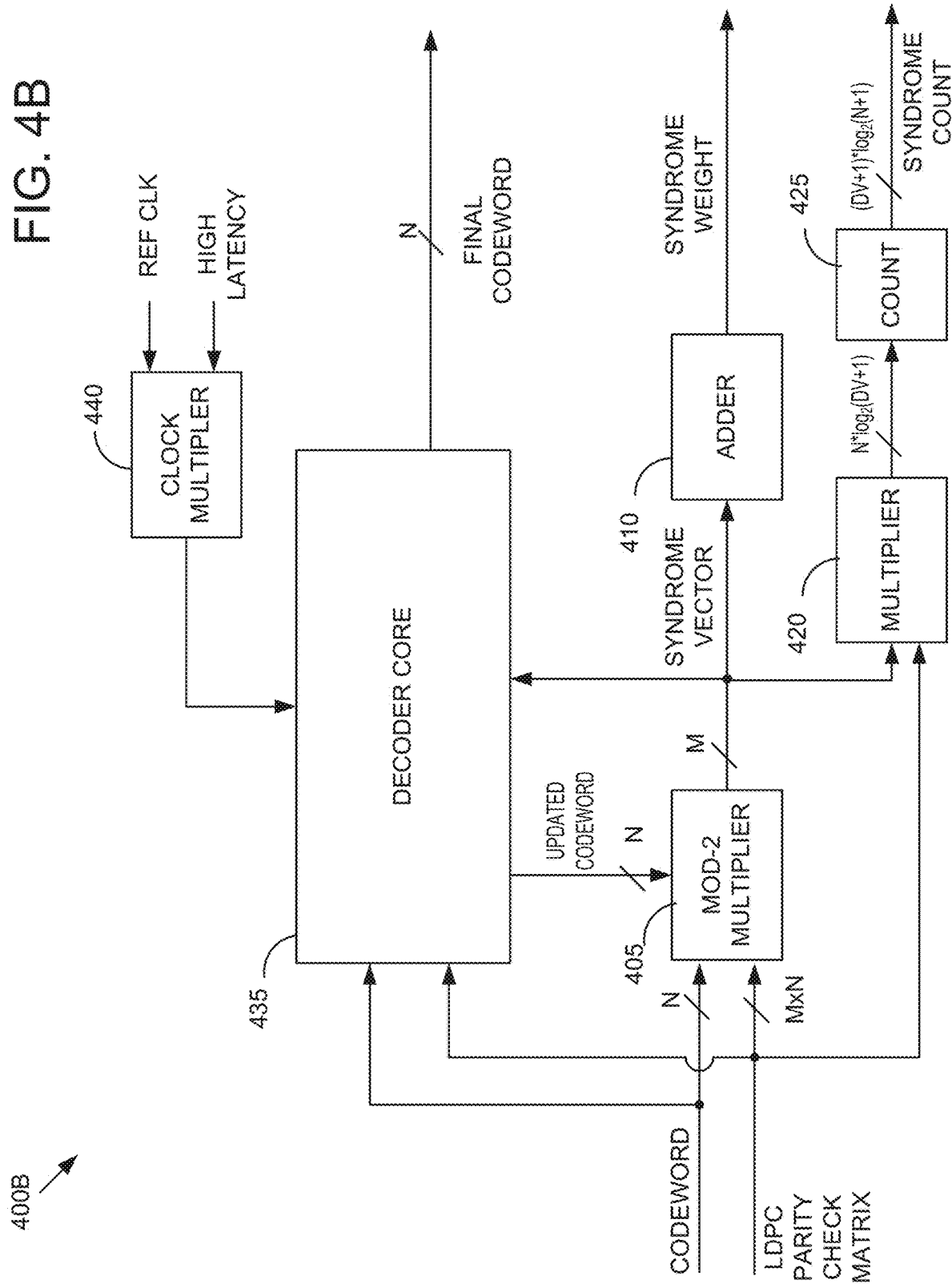
FIG. 4B is a schematic block diagram of a decoder, in accordance with some embodiments of the present disclosure.

Referring now to FIG. 4B, a schematic block diagram of the decoder 400B is shown, in accordance with some embodiments of the present disclosure. In some embodiments, the decoder 400B is similar to the decoder 400A shown in FIG. 4A except for differences described herein. In some embodiments, the decoder core 435 receives a reference clock or a modified (e.g., multiplied) reference clock. In addition to the components included in the decoder 400A, the decoder 400B includes a (e.g., controllable) clock multiplier 440. In some embodiments, in additional to or alternative to the high latency being an input to the decoder core 435, the high latency is an input to the clock multiplier 440. In some embodiments, the clock multiplier 440 receives a reference clock at a signal input and the high latency at a control input. In some embodiments, responsive to the high latency indicating a high latency condition (e.g., that the decoder takes more than a predetermined amount of time to converge), the clock multiplier 440 multiplies the reference clock by a predetermined number greater than 1 to generate an multiplied reference clock. In some embodiments, responsive to the high latency indicating no high latency condition (e.g., that the decoder takes less than a predetermined amount of time to converge), the clock multiplier 440 passes the reference clock to its output (e.g., or multiplies the clock reference by one). In some embodiments, the clock multiplier 440 sends the clock reference or the multiplied clock reference to the decoder core 435. In some embodiments, the decoder core 435 directly receives the clock reference or the multiplied clock reference from the action determiner 325.

FIG. 5 is a flow chart illustrating an embodiment of a process 500 for predicting iterative decoder performance. Additional, fewer, or different operations may be performed, in any order, in the process 500 depending on the embodiment. The process 500 may be implemented with a processor, such as the CPU 145, of an apparatus (e.g., one of the decoder systems 300A-300D, the decoder 305, one or more of the classifiers 310A-310N, or one or more action determiners 325) based on firmware or other instructions stored in in controller volatile memory (e.g., the local memory 150) or in the non-volatile memory array 135. For sake of brevity, operations of one or more processors (e.g., the CPU 145) associated with the apparatus are described as operations of the apparatus.

Referring now for FIG. 5, a decoder apparatus, such as the decoder system 300D, measures the outcome (e.g., success and number of iterations) of a training codeword (502). The decoder system calculates features of the training codeword (504). The decoder system applies the features to weights to calculate an outcome (506). The decoder system determines whether the calculated outcome is within a predetermined range of the measured outcome (508). If the decoder system determines that the calculated outcome is not within the predetermined of the measured outcome, the decoder system adjusts the weights (510). If the decoder system determines that the calculated outcome is within the predetermined of the measured outcome, the decoder system determines whether there are more training codewords (512). If the decoder system determines that there are more training codewords, the process 500 returns to block 502. If the decoder system determines that there are no more training codewords, the fail-fast decoder system calculates features of a codeword (i.e., a "live" codeword) (514). The decoder system predicts the outcome based on the features and the weights (516). The decoder system determines whether the predicted outcome satisfies a predetermined threshold (518). If the decoder system determines that the predicted outcome does not satisfy the predetermined threshold, the decoder adjusts one or more decoder parameters (520) and the process 500 returns to block 514. If the decoder system determines that the predicted outcome satisfies the predetermined threshold, the decoder system decodes the codeword (522).

Advantageously, some embodiments of the present disclosure improve latency and outcome. By predicting the decoding success and latency, some embodiments of the system can perform alternative actions such as read soft-bits, threshold calibration, XOR recovery, etc. Predicting the decoder behavior and performing alternative actions can save hundreds of micro-seconds and up to milliseconds. Further, some embodiments of the present disclosure allows reporting a fast failure to the host in set-ups that permit Fast-Fail modes.

CONFIGURATION OF EXEMPLARY EMBODIMENTS

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. An apparatus, comprising:
    a non-volatile memory configured to store one or more codewords; and
    a processor in communication with the memory and configured to read codewords from the memory, the processor configured to:
        train a classifier, wherein, to train the classifier, the processor is further configured to:
            measure a first outcome of decoding a plurality of training codewords;
            calculate one or more features of the plurality of training codewords based on a plurality of weights;
            calculate a second outcome of decoding the plurality of training codewords based on the one or more features;
            determine whether the second outcome of decoding the plurality of training codewords is within a predetermined range of the first outcome of decoding the plurality of training codewords; and
            adjust the plurality of weights if the second outcome of decoding the plurality of training codewords is not within the predetermined range of the first outcome of decoding the plurality of training codewords;
        read a codeword from the memory;
        calculate one or more features of the read codeword;
        predict an outcome of decoding the read codeword using the calculated one or more features of the read codeword; and
        determine, using the trained classifier, whether the predicted outcome of decoding the read codeword satisfies a predetermined threshold.

2. The apparatus of claim 1, wherein the outcome of decoding the read codeword is at least one of a time to successfully decode the read codeword and a number of iterations to successfully decode the read codeword.

3. The apparatus of claim 1, wherein the processor is further configured to adjust one or more decoder parameters used for decoding the read codeword if the processor determines that the outcome of decoding the read codeword does not satisfy the predetermined threshold.

4. The apparatus of claim 3, wherein the one or more decoder parameters include at least one of a log likelihood ratio (LLR), a bit-flipping threshold, a damping factor, an iteration number, a clipping value, a decoding frequency, a decoding gear, a soft-read bit, and a read voltage threshold.

5. The apparatus of claim 1, wherein the processor is further configured to decode the read codeword if the processor determines that the outcome of decoding the read codeword satisfies the predetermined threshold.

6. The apparatus of claim 1, wherein the one or more features of the read codeword include at least one of an initial syndrome weight, an initial syndrome count, a syndrome weight after one or more decoding iterations, and a syndrome count after one or more decoding iterations.

7. The apparatus of claim 6, wherein the processor is further configured to determine the initial syndrome count by binning each bit of the read codeword into one of a predetermined number of bins based on how many unsatisfied checks each bit has.

8. The apparatus of claim 1, wherein the classifier includes at least one of a support vector machine, k-nearest neighbors, decision trees, and neural networks.

9. The apparatus of claim 1, wherein the processor is further configured to:
    read the plurality of training codewords from the memory.

10. The apparatus of claim 1, wherein the processor is further configured to:
    generate the plurality of training codewords.

11. A method, comprising:
    training, by a processor, a classifier by:
        measuring a first outcome of decoding a plurality of training codewords,
        calculating one or more features of the plurality of training codewords based on a plurality of weights,
        calculating a second outcome of decoding the plurality of training codewords based on the one or more features, determining whether the second outcome of decoding the plurality of training codewords is within a predetermined range of the first outcome of decoding the plurality of training codewords, and adjusting the plurality of weights if the second outcome of decoding the plurality of training codewords is not within the predetermined range of the first outcome of decoding the plurality of training codewords;

reading, by the processor, a codeword from a memory;

calculating, by the processor, one or more features of the read codeword;

predicting, by the processor, an outcome of decoding the read codeword; and determining, by the processor and using the trained classifier, whether the outcome of decoding the read codeword satisfies a predetermined threshold.

12. The method of claim 11, wherein the outcome of decoding the read codeword is at least one of a time to successfully decode the read codeword and a number of iterations to successfully decode the read codeword.

13. The method of claim 11, wherein the method further comprises adjusting, by the processor, one or more decoder parameters if the processor determines that the outcome of decoding the read codeword does not satisfy the predetermined threshold.

14. The method of claim 13, wherein the one or more decoder parameters include at least one of a log likelihood ratio (LLR), a bit-flipping threshold, a damping factor, an iteration number, a clipping value, a decoding frequency, a decoding gear, a soft-read bit, and a read voltage threshold.

15. The method of claim 11, wherein the method further comprises decoding, by the processor, the read codeword if the processor determines that the outcome of decoding the read codeword satisfies the predetermined threshold.

16. The method of claim 11, wherein the one or more features include at least one of an initial syndrome weight, an initial syndrome count, a syndrome weight after one or more decoding iterations, and a syndrome count after one or more decoding iterations.

17. The method of claim 16, wherein the method further comprises determining, by the processor, the initial syndrome count by binning each bit of the codeword into one of a predetermined number of bins based on how many unsatisfied checks each bit has.

18. The method of claim 11, further comprising:
reading the plurality of training codewords from the memory.

19. The method of claim 11, further comprising:
generating the plurality of training codewords.

20. An apparatus, comprising:
a memory configured to store a plurality of codewords; and
processing means in communication with the memory, wherein the processing means includes:
means for training a classifier by: measuring a first outcome of decoding a plurality of training codewords; calculating one or more features of the plurality of training codewords based on a plurality of weights; calculating a second outcome of decoding the plurality of training codewords based on the one or more features; determining whether the second outcome of decoding the plurality of training codewords is within a predetermined range of the first outcome of decoding the plurality of training codewords; and adjusting, by the processor, the plurality of weights if the second outcome of decoding the plurality of training codewords is not within the predetermined range of the first outcome of decoding the plurality of training codewords;
means for reading a codeword stored in the memory;
means for calculating one or more features of the read codeword;
means for predicting an outcome of decoding the read codeword;
means for determining whether the predicted outcome of decoding the read codeword satisfies a predetermined threshold; and
means for selecting decoder parameters to alter the outcome of decoding the read codeword.

* * * * *